United States Patent [19]
Easterday

[11] Patent Number: 4,835,736
[45] Date of Patent: May 30, 1989

[54] DATA ACQUISITION SYSTEM FOR CAPTURING AND STORING CLUSTERED TEST DATA OCCURRING BEFORE AND AFTER AN EVENT OF INTEREST

[75] Inventor: John L. Easterday, Portland, Oreg.
[73] Assignee: Tektronix, Inc., Beaverton, Oreg.
[21] Appl. No.: 899,854
[22] Filed: Aug. 25, 1986
[51] Int. Cl.⁴ .................. G06F 3/05; G06F 11/28
[52] U.S. Cl. ................................... 364/900
[58] Field of Search ... 364/200 MS File, 900 MS File; 371/20

[56] References Cited

U.S. PATENT DOCUMENTS

| | | | |
|---|---|---|---|
| 4,139,903 | 2/1979 | Morril et al. | 364/900 |
| 4,303,948 | 12/1981 | Haag et al. | 364/900 |
| 4,373,193 | 2/1983 | Haag et al. | 364/900 |
| 4,473,889 | 9/1984 | Ross | 364/900 |
| 4,480,317 | 10/1984 | Haag et al. | 364/900 |
| 4,553,223 | 11/1985 | Bouhelier et al. | 364/900 |
| 4,660,198 | 4/1987 | Lyon | 371/15 |

*Primary Examiner*—Archie E. Williams, Jr.
*Assistant Examiner*—Ayni Mohamed
*Attorney, Agent, or Firm*—Mark L. Becker; Robert S. Hulse

[57] ABSTRACT

A memory pointer circuit includes a plurality of counters and a programmable logic array for controlling the counters to generate addresses for an acquisition memory. The programmable logic array directs a lower counter to generate a repeating sequence of addresses to store data before an event occurs, each pass through the sequence causing previously written data to be overwritten until an event has occurred and is stored in memory. The programmable logic array then directs the upper counters to increment and the lower counter to generate a following sequence of addresses to store data after the event occurs. Once the following sequence is complete, the upper counters are again incremented and the repeating sequence of addresses is again generated. The procedure is repeated to store multiple clusters of data and events in the acquisition memory. Once the acquisition memory is full, the stored data and events can be saved or overwritten.

6 Claims, 3 Drawing Sheets

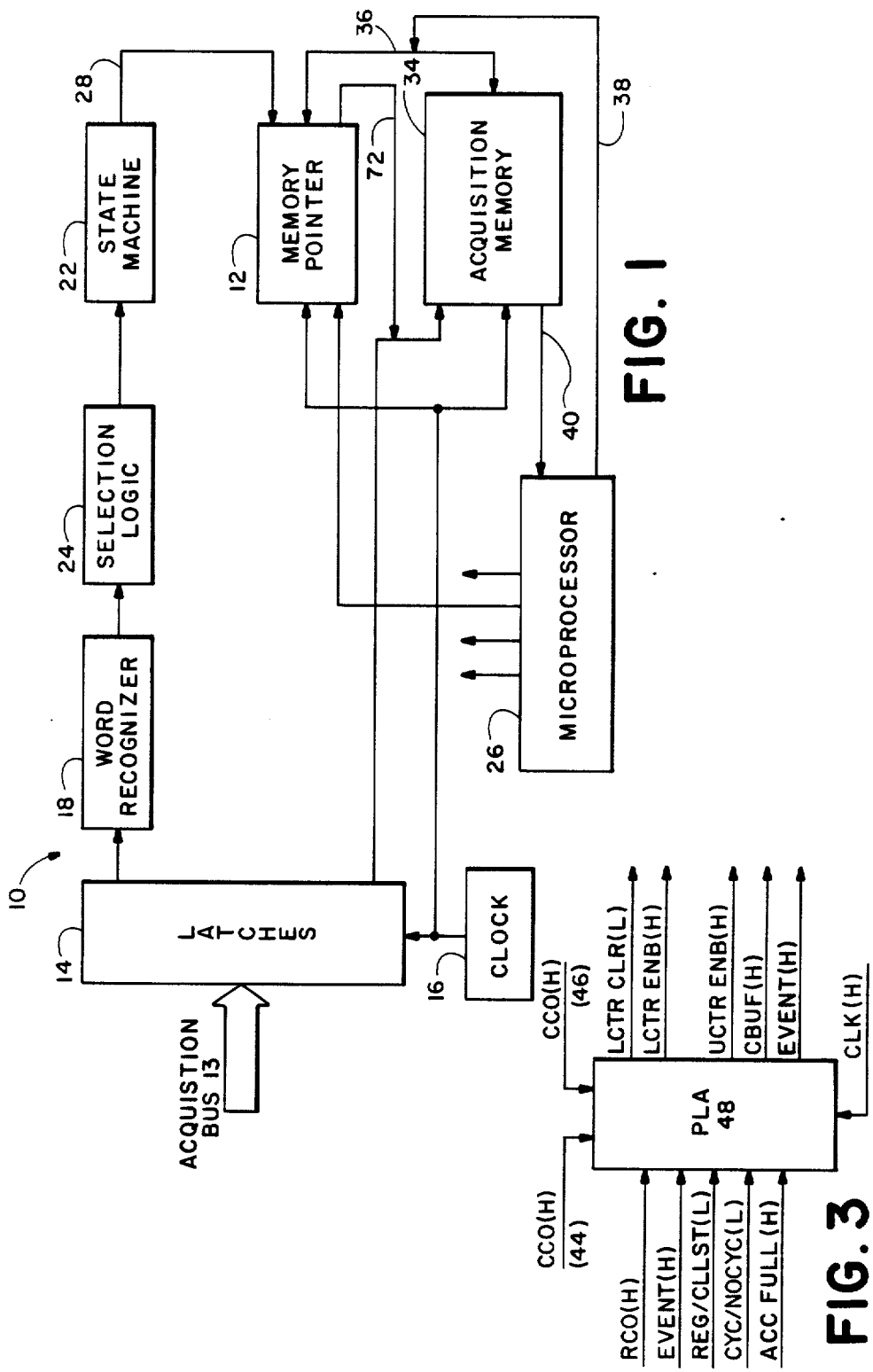

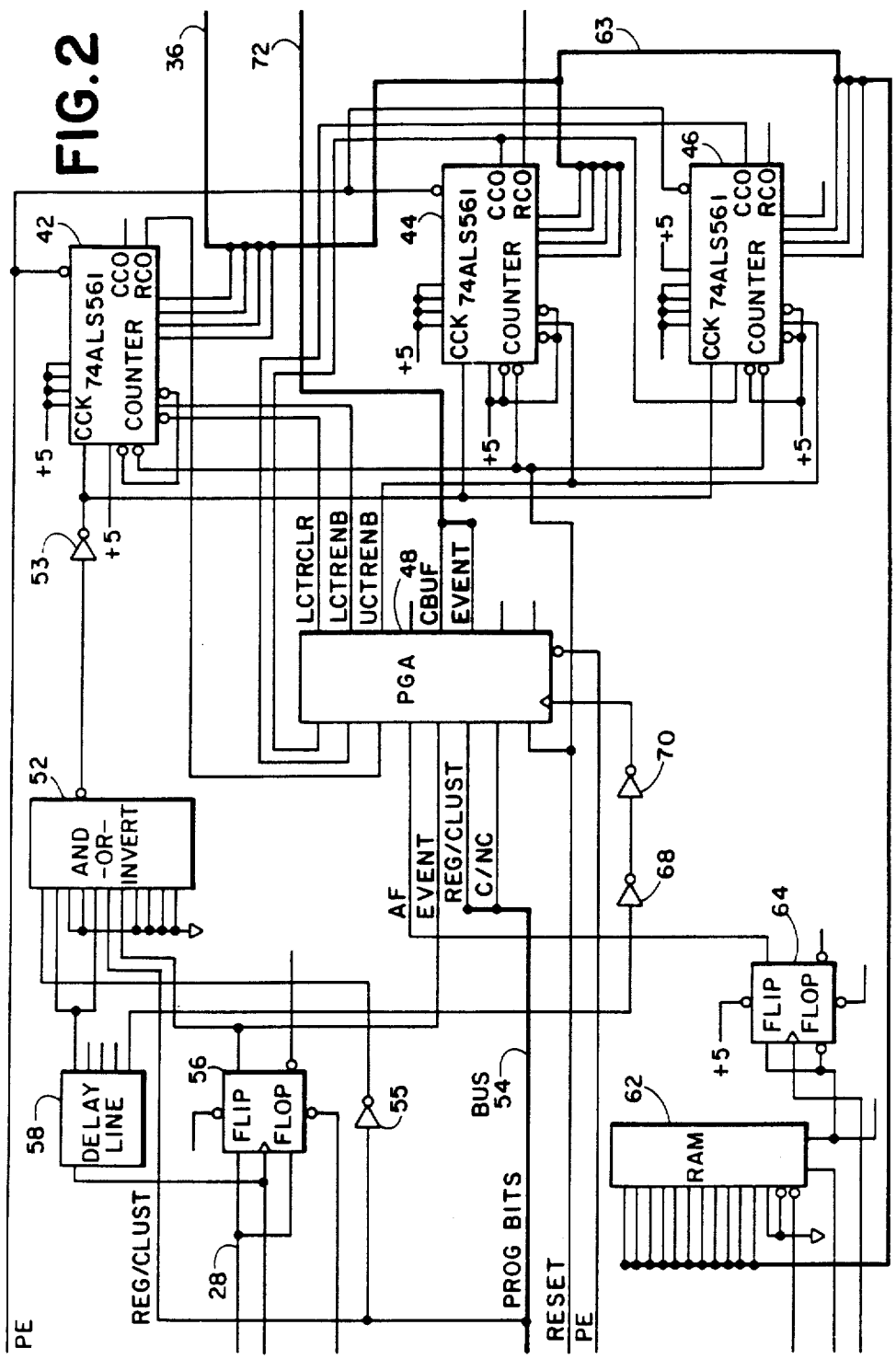

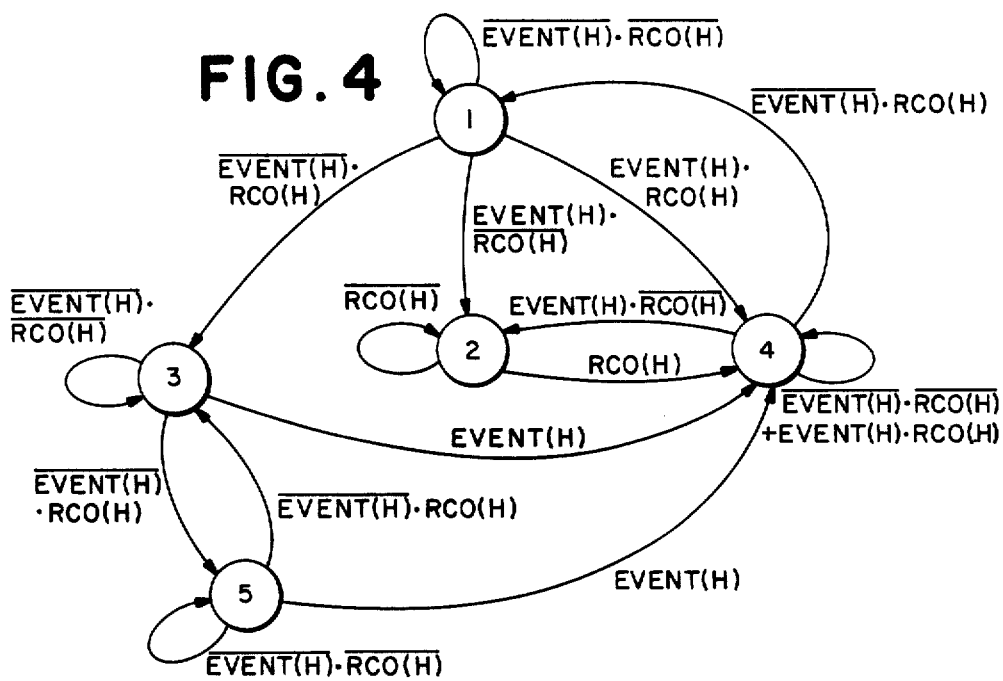
FIG. 4
| PLA STATE | PLA OUTPUT DESIGNATED*QUALIFIED BY |
|---|---|
| 1 | UCTRENB(H) = EVENT(H)·RCO(H) |
| 2 | UCTRENB(H) = RCO(H) |
| 3 | UCTRENB(H) = EVENT(H); LCTR CLR(L) = EVENT(H) |
| 4 | UCTR ENB(H) = RCO(H) |
| 5 | UCTR ENB(H) = EVENT(H); LCTR CLR(L) = EVENT(H) |
FIG. 5
*PLA OUTPUTS FURTHER QUALIFIED BY CYC/NOCYC(L) AND ACCFULL(H)
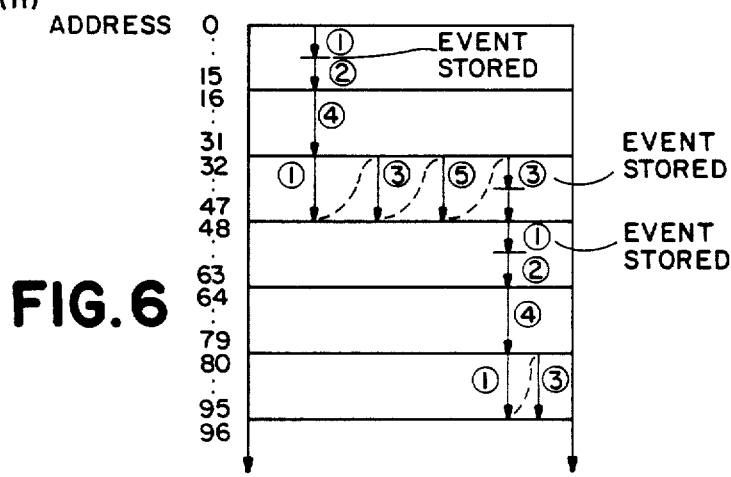
FIG. 6

DATA ACQUISITION SYSTEM FOR CAPTURING AND STORING CLUSTERED TEST DATA OCCURRING BEFORE AND AFTER AN EVENT OF INTEREST

FIELD OF THE INVENTION

This invention relates to data acquisition systems. More particularly, this invention relates to a memory pointer for such a system for acquiring data occurring before and after an event of interest, known as "clustering" of data around an event. An event is one of a number of specified combinations of signals, such as an instruction generated by logic within a circuit under test.

BACKGROUND OF THE INVENTION

Logic analyzers are commonly used today to analyze the digital signals generated within a circuit. A logic analyzer performs a number of functions, including acquiring and storing signals generated by logic within the circuit under test. One particular use of an analyzer is to monitor the instructions of a microprocessor within a circuit and data generated therewith to determine if the circuit is operating as desired.

In one aspect of its monitoring operation, the analyzer acts as a data acquisition system to acquire and store in memory data "clustered" around an event, i.e., data occurring before and after the event. The data is first continuously acquired and stored until an event occurs. With a limited size acquisition memory, the continuous storage of new data will cause the memory to "roll over" if no event occurs and is stored before the memory reaches its maximum address. Once it rolls over, data is written over previously acquired data until an event terminates the acquisition. The event itself is then stored in memory and data occurring after the event is acquired and stored until the memory reaches its maximum address. The event is therefore stored at an intermediate memory address with data clustered around it at adjacent addresses.

The primary drawback of conventional data acquisition systems is the limited clustering available. Only data clustered around a single event can be permanently stored, regardless of the acquisition memory size. To store data surrounding several events, the acquisition system must be continuously reset after each acquisition. Data can be lost if several events of interest occur so rapidly in sequence that the acquisition memory cannot be cleared fast enough to accept new data.

A second drawback of conventional data acquisition systems is the unbalanced acquisition of data clustered around an event. The event may be stored at any intermediate memory address, close to or far from a memory boundary. Several data samples may be stored before the event and many more than are useful stored afterward. The problem is compounded because the after-acquired data may be written over previously acquired data of substantial value.

A data acquisition system that overcomes these drawbacks should provide for multiple clustering of events and data within an acquisition memory so that a number of events and their data can be acquired and permanently stored. The system should also provide as much as possible for a balanced acquisition of data before and after each event. A balance ensures that sufficient data is acquired for analysis of the test circuit's operation.

SUMMARY OF THE INVENTION

An object of the invention, therefore, is to provide an improved data acquisition system for acquiring data clustered around an event of interest, the event being defined as specified combination of input signals.

A second object of the invention is to provide for multiple clustering of data and events within a limited acquisition memory.

A third object of the invention is to balance the acquisition of data around each of the several events acquired and permanently stored in memory.

A fourth object of the invention is to implement a memory pointer for generating addresses for data and events within a data acquisition system using commmercially available logic circuits to generate the memory addresses.

To achieve these objects, a memory pointer according to the invention comprises counters for generating memory addresses and a programmable logic array for controlling the counters. The logic array directs the counters to generate a repeating series of addresses to store data samples. The repeating series causes data to overwrite previously acquired data at those addresses until a specified event occurs and is stored in memory. The counters are then directed to generate a following series of addresses to store data after each specified event is stored. Once the following series is completed, the logic array directs the counters to generate another repeating series of addresses before and another following series of addresses after each specified event. By this technique, the memory can store a plurality of specified events along with related data.

The counters in this embodiment may include a plurality of digital counters, with a first counter generating lower order address bits and a second counter generating higher order address bits. The programmable logic array is configured to control the digital counters to generate the repeating sequence before and the following sequence after each specified event.

The foregoing and other objects, features, and advantages of the invention will become more apparent from the following detailed description of a preferred embodiment which proceeds with reference to the accompanying drawings.

BRIEF DESCRIPTION OF THE DRAWINGS

FIG. 1 is a block diagram of a portion of a data acquisition system including a memory pointer circuit according to the invention.

FIG. 2 is a schematic diagram of the memory pointer circuit of FIG. 1.

FIG. 3 is a schematic diagram of the input and output connections to a programmable logic array used in the memory pointer.

FIG. 4 is a state diagram showing the states of the programmable logic array of FIG. 4 for generating the memory addresses.

FIG. 5 is a programmable logic array output table showing the input signals in each state required to generate an output signal from the array.

FIG. 6 is a memory diagram illustrating the generating of addresses by the memory pointer to acquire and permanently store data and events in the acquisition memory.

DETAILED DESCRIPTION

Functional Overview of the Memory Pointer Within a Data Acquisition System

FIG. 1 shows a block diagram of a portion of the data acquisition system 10 that includes a memory pointer circuit 12 embodying the invention. The system itself may contain a number of elements, but only those elements necessary to understand the function of the memory pointer 12 are shown and discussed herein.

Target information from the circuit or device to be analyzed is carried to the system 10 through an acquisition bus 13. The information includes addresses, data, and control signals. The information is stored or latched by digital latches 14 because the information is valid on the bus 13 for only a brief period. The latches 14, as well as other elements in the system 10, are clocked by a system clock 16.

After being latched, the information is "analyzed" to determine if a specific event or sequence of events has occurred. Word recognizer logic 18 provides combinatorial event recognition of the information, and a state mahcine 22 provides sequential event recognition. The type of event recognition desired is selected by the operator via selection logic 24. These elements are controlled in a conventional manner by a microprocessor 26, with the connections to the elements omitted for clarity. When an event (sequential or combinatorial) is recognized, an event signal appears at the output of the state machine 22 on an event bus 28 that routes the signal to the memory pointer 12.

The memory pointer 12 generates memory addresses for an acquisition memory 34 to store in the memory recognized events and related data occurring before and after each event. The events and data are routed from the latches 14 on each clock signal not only to the word recognizer 18 but also directly to the acquisition memory 34. There they are stored at the addresses provided by the memory pointer 12 through an address bus 36. These addresses are generated in one of two modes of pointer operation: regular and cluster. In the regular mode, the pointer 12 stores data at an address and then checks to determine if the stored data is a recognized event. If the data is not a recognized event, a new address is not generated. The current memory address does not change, and the next data from the latches 14 is written over the previously stored data at the same address. If the data is a recognized event, the memory address is incremented and the next data is stored at a new address. Only recognized events are therefore stored in the acquisition memory 34 with the pointer 12 in the regular mode.

In the clustering mode, however, clusters of data and events are stored in the acquisition memory 34. The memory pointer 12 first generates a repeating sequence of addresses to store data each clock cycle in memory 34 in a "circular" buffer. Data continues to be written over previously acquired data in this buffer as these addresses repeat. Once an event is stored and recognized, the memory pointer moves to a new location in memory. The pointer 12 then generates a following sequence of addresses once to store data in memory 34 in a straight buffer. After completing the above-mentioned following sequence, the pointer 12 generates another repeating sequence of addresses to store data for the next event. The mode therefore allows for multiple clustering of data around events in a single acquisition memory.

In either mode, the stored data and events can be read by the microprocessor 26 via an address bus 38 and data bus 40 and can be displayed on a screen for analysis.

Circuit Description

The hardware comprising the memory pointer 12 is shown in FIG. 2 and is listed in Table 1 below. This embodiment of the invention, of course, is shown only for purposes of illustration and is not intended to limit the scope of the invention.

TABLE 1

| Element | Designation |
|---|---|
| AND-OR-INVERT gate | 74F64 |
| Delay line | TTLDL76 |
| Flip-Flop | 74F109 |
| 4-bit counter | 74ALS561 |
| Programmable logic array (PLA) | 16R8A |
| 4K static RAM | 2147H |
| Inverter | 74F04 |

Referring to FIG. 2, the counters 42, 44, 46 generate the memory addresses for the acquisition memory 34. Counter 42 provides the lower portion of the address, and counters 44 and 46 provide the upper portion, the address bits linked together on the address bus 36. The operation of the counters is controlled by a programmable logic array (PLA) 48 as described herein.

Counter 42 generates a repeating sequence of memory addresses that "rolls over" each time the counter counts past its maximum mumber, fifteen, to begin another count cycle. The counter receives a counter clock signal (CCK) at its counter clock input from AND-OR-INVERT gate 52 through an inverter 53. When counter 42 has reached its maximum count and will roll over on the next clock signal, it generates a ripple carry output (RCO) signal that is fed back to the PLA 48. PLA 48 enables and disables the counter 42 and can synchronously clear its count to zero.

Counters 44 and 46 also receive the CCK signal from gate 52 and are enabled and disabled by PLA 48. Counter 46 is further qualified by the clock carrying output (CCO) signal of counter 44. This signal is used to cascade these two counters together, so that counter 46 increments each time counter 44 completes a count cycle and will roll over on the next clock signal. Both the CCO signals of counters 44 and 46 are also fed back to the PLA 48 to alert it when either counter is about to roll over.

The source of the CCK signal of gate 52 depends on the operating mode selected. In the cluster mode, the CCK signal is provided by the system clock 16. As the clock 16 clocks data into latches 14 for the memory 34, it also clocks the counters 42, 44, 46 to generate an address for that data. In the regular mode, the CCK signal is provided by the event bus 28. Each time an event is recognized, the event signal on the bus 28 clocks the counters 42, 44, 46 to generate an address for the event.

The operating mode is selected by command to the microprocessor 26 which controls the pointer 12 via a programming bus 54. The bus 54 includes a register/cluster signal that is routed to gate 52. There the signal is combined with the event signal and system clock signal at one AND input and is inverted by inverter 55 and combined with the system clock signal at a second AND input. The event signal itself is latched from the event bus 28 by a flip-flop 56 that routes the signal to gate 52. The system clock signal is routed through a delay line circuit 58 before reaching gate 52 to match the delay of the event signal through flip-flop 56.

The PLA 48 is kept apprised at its inputs of the state of the counters 42, 44, and 46, the operation mode chosen, and the arrival of system clock and event signals. The PLA 48 also receives two additional signals: a cycle/no cycle (C/NC) signal on programming bus 54 and an acquisition memory full (AF) signal from a RAM 62. The AF signal alerts the PLA that the acquisition memory 34 is full and that further storage of data will overwrite previously stored data. The C/NC signal tells the PLA 48 whether to "cycle" and override previously clustered data when the acquisition memory is full. The RAM 62 is used to determine if the acquisition memory 34 is full. The microprocessor 26 writes a logic 1 into RAM at the first address generated by the counters 42, 44, and 46, the logic signal routed to RAM via a branch 63 of the address bus 36. The remainder of RAM 62 contains logic 0. Each time a new address is generated by incrementing the counters 42, 44, and 46, the data of RAM 62 is clocked by system clock 16 through a flip-flop 64 and read by the PLA 48 as the AF signal. The AF signal will therefore be a logic 0 until the acquisition memory cycles around to the first generated address, at which address the AF signal becomes a logic 1. The PLA 48 reads this signal if C/NC is a logic 0, calling for a "no cycle" and terminating acquisition once memory 34 is full. If, on the other hand, the C/NC signal is "cycle," the PLA 48 ignores the AF signal and will direct the counters to generate new addresses to overwrite the previously acquired data.

The pointer 12 also includes a number of elements for matching signal propagation delays through the circuit. The delay line 58 in addition to matching the delay of the event signal through flip-flop 56 also delays along with inverters 68 and 70 the propagation of the clock signal to the PLA 48. This delay enables the input signals from the counters 42, 44, and 46 to be present and stable before the PLA is clocked by the system clock to read those inputs.

Other input signals to the pointer 12 include a reset and a program enable (PE). The reset signal is generated on power-up or hardware reset to set the PLA 48 and counters 42, 44, 46 to an initial memory address of zero. The program enable signal forces the counters into a high impedance state to allow the microprocessor 26 to place an address on bus 36 to the memory 34 and read the acquisition memory 34 via bus 40.

Circuit Operation

The operation of the memory pointer 12 is controlled by PLA 48, whose inputs and outputs are shown in FIG. 3. The signals thereon are active in the logic state shown parenthetically after the signal name. For example, the output signal lower-counter-clear (LCTRCL) is active when its logic state is low. Lower-counter-enable (LCTRENB) and upper-counter-enable (UCTRENB), on the other hand, are active when their logic states are high. The other output signals are EVENT, which signals occurrence of an event, and CBUF, which indicates the data stored is in a circular buffer.

The Cluster Mode

Referring to FIGS. 4 through 6, a state diagram, output table, and memory table are shown for the PLA 48 with the pointer 12 in hte cluster mode. The clock 16 provides the counter clock signal to the counters 42, 44, and 46 in this mode, as well as the clock signal for the rest of the pointer 12 in either mode.

On power up or hardware reset, the PLA 48 begins in state 1. Counter 42, the least significant counter, counts each clock cycle to produce a sequence of addresses that repeats each sixteen clock cycles. Counters 44 and 46 are not enabled. If no event occurs within the first run through the sequence, the RCO signal is asserted (indicating the counter is ready to roll over on the next clock cycle) and the PLA 48 moves to state 3. The sequence of addresses will at this point have stored sixteen samples of data within the acquisition memory 34, one sample each clock cycle. If, however, an event occurs and is stored before the counter 42 completes a first pass through the sequence, the PLA 48 moves to state 2. A third possibility also exists. If the event occurs and is stored when the counter generates its maximum address and RCO is asserted, the PLA 48 moves directly to state 4.

In state 3 the counter passes again through the sequence, awaiting the occurrence of an event and causing data samples to be written over the previously acquired data. If the counter again rolls over, it moves to state 5 and repeats the sequence. The counter then continues to move between states 3 and 5 until an event occurs. Once that happens, the PLA moves from either state 3 or 5 to state 4. In the process, of course, an event and fifteen data samples preceding the event have been stored in a circular buffer in memory with the event likely stored at an intermediate address in the sequence.

Recall that if state 2 is entered, an event and fewer than fifteen data samples preceding the event have been stored in memory 34. The counter 42 continues to generate addresses to complete a first pass through the sequence and store data samples occurring after the event. Once the pass is completed, the RCO signal is asserted and PLA 48 moves from state 2 to state 4.

In state 4 the PLA enables the upper counters 44 and 46 to increment on the next system clock signal so that a new sequence of addresses is then generated by these counters in cooperation with counter 42. This following sequence of sixteen addresses stores data samples occurring after the event in a straight buffer in memory 34. The PLA remains in state 4 until the RCO signal is again asserted, indicating the completion of the following sequence. The PLA 48 then returns to state 1 to generate another repeating sequence of addresses. In the process, the upper counters are again incremented to provide a new sequence beyond the following sequence.

FIG. 5 indicates when the PLA output signals are asserted to manipulate the counters in each PLA state. In state 1, for example, the upper counters will be enabled by UCTRENB if the RCO and EVENT signals are present, moving the PLA directly to state 4. An event has occurred and a following series of addresses is to be generated. Counter 44 will then increment on the next clock signal. Counter 46 will also increment if counter 44 is rolling over and its CCO signal is asserted. In state 2, the upper counters 44 and 46 will be enabled by UCTRENB when the RCO signal is asserted at the completion of a first pass through the repeating sequence. Again, the PLA moves to state 4. In states 3 and 5, the upper counters will be enabled by UCTRENB and the lower counter 42 cleared by LCTRCLR when an event occurs and is stored, moving the PLA to state 4. The counter 42 is cleared to preserve data samples previously stored in the sequence at addresses above the event address. Otherwise this data would be overwritten by data following the event. By incrementing counters 44 and 46 while clearing counter 42, the next sequence of addresses will begin at a different location. Once in state 4, the upper counters will again be enabled by UCTRENB to increment when RCO is asserted, indicating counter 42 will roll over on the next clock cycle to complete the following sequence of addresses.

State 2 of the PLA exists to handle two special cases: where an event occurs before counter 42 has rolled over once; and where two events occur less than sixteen clock cycles (and therefore data samples) apart. In the first case, the PLA 48 moves to state 2, stores the event, and then completes the sequence before moving to state 4. In the second case, the PLA 48 moves from state 4 to state 2 to complete the sequence of addresses following the first event and then back to state 4 to generate a second, separate sequence of addresses following the second event.

FIG. 6 is a memory diagram illustrating the operation of the PLA 48 in storing data samples in memory. Beginning at address 0, the PLA is in state 1 and counter 42 begins to generate the lower bits of addresses to store data samples. An event, however, occurs and is stored before the counter passes once through the sequence. The PLA in response moves to state 2 and completes the sequence of addresses to store data occurring after the event. The RCO signal of counter 42 is asserted, and the PLA moves from state 2 to state 4 to generate the following sequence of sixteen addresses by incrementing counter 44 and running counter 42 through another sequence.

The PLA then enables the upper counters 44 and 46 to increment again on the next clock cycle and returns to state 1 to generate another repeating sequence of addresses. No event occurs this time before the RCO signal is asserted, and the PLA moves to state 3. From there, it moves between states 5 and 3 until an event occurs and is stored midway in the current sequence. The PLA then jumps the address to the next sequence to preserve pre-event data by incrementing counter 44 and clearing counter 42. The PLA is now in state 4, generating addresses to store data occurring after the event.

A second event occurs before sixteen addresses in the sequence following the first event have been generated and the PLA moves to state 2. There it completes the first following sequence and then moves back to state 4 to generate a second following sequence for the second event. Once the second following sequence is completed, the PLA returns again to state 1, incrementing the upper counters again in the process.

The process of acquiring and storing data and events continues until the acquisition memory is full. At this point, the AF signal is asserted and the PLA determines whether it should begin a second cycle through the acquisition memory or stop until the current data is viewed. That decision is controlled by the state of the C/NC signal on the programming bus 54.

Whether the data stored in memory occurred before or after an event stored therein is determined by microprocessor 26 from the logic states of CBUF and EVENT. Referring to FIGS. 1 and 2, these signals are routed to memory 34 on a data bus 72 to be stored with the data and events. With these two signals, the microprocessor 26 can identify the data stored in addresses higher than the event's address as preceding or following data and thereby determine where to begin reading the data. For example, if counter 42 has made one pass through a repeating sequence and an event occurs and is stored, then data in the higher addresses in the sequence are preceding data. Both EVENT and CBUF are in the high logic state, indicating a circular buffer in memory. Microprocessor 26 will begin reading at the address above the event and then "around" to the lower addresses below the event. If no CBUF signal is asserted, then the data is stored in a straight buffer in memory and the microprocessor 26 reads the data in order of increasing address.

The Regular Mode

In the regular mode, the event signal from the event bus 28 is the CCK signal to the counters 42, 44, and 46. Each time an event is detected, it is stored and the counters incremented. If data other than an event is detected, no new address is generated and the data is continually overwritten until an event occurs and is stored. In the end, the acquisition memory 34 is filled with events, but not with related data occurring before and after each event.

The PLA 48 in this mode acts to cascade the counters 42, 44, and 46 together, enabling an upper counter to increment on the next CCK signal once a lower counter has reached its maximum count.

Having illustrated and described the principles of the invention in a preferred embodiment, it should be apparent to those skilled in the art that the invention can be modified in arrangement and detail without departing from such principles. For one, the circuitry shown herein could be implemented in an integrated circuit by one skilled in the art. For another, the counters could be replaced with equivalent elements that generate an address pattern that is not necessarily a sequence, such as a series. I therefore claim all modifications coming within the spirit and scope of the following claims.

I claim:

1. In a data acquisition system, a memory pointer circuit for storing in an acquisition memory test data from a circuit under test occurring before and after specified events, the memory pointer circuit comprising:

signaling means for signaling the occurrence of each specified event;

address generating means in communication with the signaling means and the acquisition memory for generating memory addresses to store test data and specified events in memory; and control means in communication with the signaling means and the address generating means for directing the address generating means to generate a repeating series of addresses to store test data in memory occurring before each specified event, the repeating series of addresses causing the stored test data to overwrite previously stored test data in memory until the specified event is signaled and stored in memory, the control means then directing the address generating means to generate a following series of addresses to store test data occurring after each specified event is stored, the control means directing the address generating means to generate a second repeating series of addresses before and a second following series of addresses after a second specified event is sensed to enable the memory to store a plurality of specified events along with related test data.

2. The circuit of claim 1 in which the address generating means includes a plurality of digital counters, a first counter for generating a repeating sequence of lower order address bits and a second counter for generating higher order address bits, the second counter incrementing after the occurrence of a specified event and incrementing again after completion of the following series of addresses to generate a plurality of repeating and following series of addresses for memory.

3. The circuit of claim 1 in which the control means includes a programmable logic array means for generating control signals in response to a specified event to control the address generating means.

4. The circuit of claim 1 including RAM memory means for determining when the acquisition memory is full and alerting the control means that further storage of data will overwrite previously stored events and related data.

5. In a data acquisition system, a memory pointer circuit for storing in an acquisition memory test data from a circuit under test occurring before and after specified events, the memory pointer circuit comprising:

an event bus for signaling the occurrence of a specified event;

a first counter for generating the lower portion of the memory address;

second counter means for generating the upper portion of the memory address; and a programmable logic array means in communication with the event bus and the first and second counters for directing the first counter to generate a repeating series of address bits as the lower portion of the memory address to store test data in the acquisition memory occurring before the specified event, each generation of address bits in the series causing the memory to overwrite previously stored test data at that address until the specified event occurs and is stored in memory, the logic means then directing the second counter to increment the upper portion of the memory address and generate with the first counter a following series of addresses to store test data occurring after each specified event, the logic array means further directing the second counter to increment the upper portion of the memory address again after completion of the following series of addresses, the first counter then generating another repeating series of addresses as the lower portion of the memory address and generating with the second counter another series of following addresses for each specified event that is stored.

6. The memory pointer circuit of claim 5 in which the first and second counter means comprise 4-bit digital counters.

* * * * *